United States Patent
Seetharaman et al.

(10) Patent No.: US 11,863,073 B2
(45) Date of Patent: Jan. 2, 2024

(54) DC-DC CONVERTER WITH ADAPTIVE ZERO TRACKING

(71) Applicant: Texas Instruments Incorporated, Dallas, TX (US)

(72) Inventors: Narayanan Seetharaman, Freising (DE); Julian Leonhard Becker Ferreira, Freising (DE); Puneet Sareen, Freising (DE); Stefan Dietrich, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 190 days.

(21) Appl. No.: 17/490,764

(22) Filed: Sep. 30, 2021

(65) Prior Publication Data

US 2022/0109371 A1    Apr. 7, 2022

Related U.S. Application Data

(60) Provisional application No. 63/088,773, filed on Oct. 7, 2020.

(51) Int. Cl.
*H02M 3/158* (2006.01)
*H02M 1/00* (2006.01)
*H03K 3/0233* (2006.01)

(52) U.S. Cl.
CPC ....... *H02M 3/1584* (2013.01); *H02M 1/0009* (2021.05); *H02M 1/0025* (2021.05); *H03K 3/02337* (2013.01)

(58) Field of Classification Search
CPC .......... G05F 1/462; G05F 1/465; G05F 1/468; G05F 1/56; G05F 1/575; G05F 1/562;
(Continued)

(56) References Cited

U.S. PATENT DOCUMENTS

| 7,821,238 B1 | 10/2010 | Li | |
|---|---|---|---|
| 8,866,450 B2 * | 10/2014 | Kirchner | H02M 3/07 323/222 |

(Continued)

FOREIGN PATENT DOCUMENTS

KR          101173614 B1 * 10/2010 .............. H02M 1/08

OTHER PUBLICATIONS

Search Report for PCT Patent Application No. PCT/US2021/053881, dated Jan. 13, 2022, 1 page.

*Primary Examiner* — Jeffrey A Gblende

(74) *Attorney, Agent, or Firm* — Ray A. King; Frank D. Cimino

(57) ABSTRACT

A DC-DC converter includes an output terminal, a reference voltage source, an error amplifier, and a compensation circuit. The error amplifier is coupled to the output terminal and the reference voltage source. The error amplifier is configured to generate an error signal representative of a difference between a voltage at the output terminal and a reference voltage provided by the reference voltage source. The compensation circuit is coupled to the error amplifier. The compensation circuit includes a resistor, a capacitor, and a switch control circuit. The resistor is coupled to the error amplifier. The capacitor is coupled to the resistor. The switch control circuit is configured to modulate connection of the resistor to the capacitor based on a switching frequency of the DC-DC converter.

18 Claims, 11 Drawing Sheets

(58) Field of Classification Search
CPC .......... G05F 1/565; G05F 1/567; G05F 1/569; G05F 1/571; G05F 1/573; G05F 1/5735; G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/52; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H05B 39/048; B23K 11/24; H04B 2215/069

See application file for complete search history.

(56) References Cited

U.S. PATENT DOCUMENTS

| | | | |
|---|---|---|---|
| 8,957,661 B2 | 2/2015 | Heo et al. | |
| 9,343,965 B2* | 5/2016 | Yuan | H02M 3/156 |
| 10,186,962 B2* | 1/2019 | Matsuura | H02M 3/335 |
| 10,996,701 B1* | 5/2021 | Wu | G05F 1/575 |
| 2005/0001597 A1 | 1/2005 | Walters et al. | |
| 2015/0155783 A1 | 6/2015 | Li et al. | |

* cited by examiner

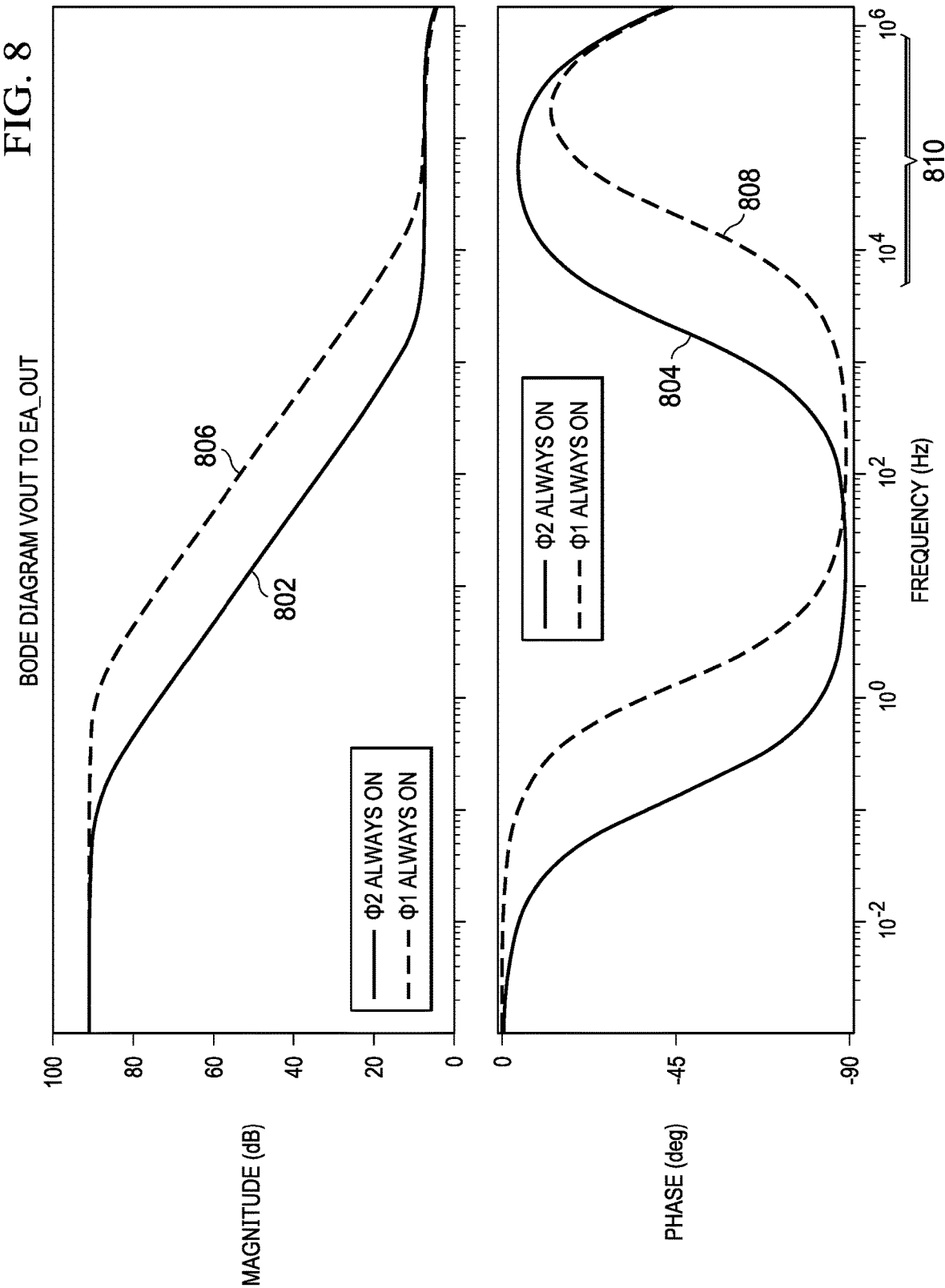

11,863,073 B2

DC-DC CONVERTER WITH ADAPTIVE ZERO TRACKING

CROSS-REFERENCE TO RELATED APPLICATIONS

This application claims priority to U.S. Provisional Application No. 63/088,773, filed Oct. 7, 2020, entitled "Adaptive Zero Tracking of Switching Frequency to Avoid Irregular Pulsing at Light Load in Switching DC/DC Converters," which is hereby incorporated by reference in its entirety.

BACKGROUND

A switch-mode power supply is an electronic circuit that converts an input direct current (DC) supply voltage into one or more DC output voltages that are higher or lower in magnitude than the input DC supply voltage. A switch-mode power supply that generates an output voltage lower than the input voltage is termed a buck or step-down converter. A switch-mode power supply that generates an output voltage higher than the input voltage is termed a boost or step-up converter. The stability of the switch-mode power supply may be compromised by gain and phase-shift introduced in the control loop of the power supply. Compensation may be applied in a switch-mode power supply to counteract the gain and phase shift.

SUMMARY

In one example, a DC-DC converter includes an error amplifier and a compensation circuit. The error amplifier includes an output. The compensation circuit includes a first resistor, a first switch, a second resistor, a second switch, and a capacitor. The first resistor includes a first terminal and a second terminal. The first terminal is coupled to the output of the error amplifier. The first switch includes a first terminal and a second terminal. The first terminal of the first switch is coupled to the second terminal of the first resistor. The second resistor includes a first terminal and a second terminal. The first terminal of the second resistor is coupled to the output of the error amplifier. The second switch includes a first terminal and a second terminal. The first terminal of the second switch is coupled to the second terminal of the second resistor. The second terminal of the second switch is coupled to the second terminal of the first switch. The capacitor includes a first terminal and a second terminal. The first terminal of the capacitor is coupled to the second terminal of the first switch. The second terminal of the capacitor is coupled to ground.

In another example, a DC-DC converter includes an output terminal, a reference voltage source, an error amplifier, and a compensation circuit. The error amplifier is coupled to the output terminal and the reference voltage source. The error amplifier is configured to generate an error signal representative of a difference between a voltage at the output terminal and a reference voltage provided by the reference voltage source. The compensation circuit is coupled to the error amplifier. The compensation circuit includes a resistor, a capacitor, and a switch control circuit. The resistor is coupled to the error amplifier. The capacitor is coupled to the resistor. The switch control circuit is configured to modulate connection of the resistor to the capacitor based on a switching frequency of the DC-DC converter.

In a further example, an inverting buck-boost converter includes an output terminal, a high-side transistor, a low-side transistor, and a controller. The controller is coupled to the output terminal, the high-side transistor, and the low-side transistor. The controller includes a reference voltage source, an error amplifier, and a compensation circuit. The error amplifier is coupled to the output terminal and the reference voltage source. The error amplifier is configured to generate an error signal representative of a difference between a voltage at the output terminal and a reference voltage provided by the reference voltage source. The compensation circuit is coupled to the error amplifier. The compensation circuit includes a first resistor, a capacitor, a first switch, a second resistor, a second switch, and a switch control circuit. The first resistor is coupled to the error amplifier. The capacitor is coupled to the first resistor. The first switch is configured to couple the first resistor to the capacitor. The second resistor is coupled to the error amplifier. The second switch is configured to couple the second resistor to the capacitor. The switch control circuit is configured to modulate the first switch and the second switch based on a switching frequency of the high-side transistor and the low-side transistor.

BRIEF DESCRIPTION OF THE DRAWINGS

FIG. 8 is a bode diagram for an example of the compensation circuit of FIG. 7.

DETAILED DESCRIPTION

Compensation circuits are employed to stabilize the control loop in DC-DC converters and other feedback loop-controlled circuits. The type (e.g., type-1, type-2, or type-3) of compensation circuit employed is selected based on various parameters (e.g., output filter component type and size, switching frequency, bandwidth, etc.) of the circuit being controlled. Type-2 compensation is widely used in DC-DC converters. For example, type-2 compensation may be used in applications where the frequency of the zero caused by the circuit output capacitor and its equivalent series resistance is smaller than the closed loop bandwidth of the control loop.

DC-DC converters that use voltage-controlled oscillator (VCO) based pulse frequency mode (PFM) in light load conditions suffer from phase margin degradation due to the switching frequency pole. Pulse width modulation (PWM)

based DC-DC converters that implement pulse skipped mode (PSM) operation exhibit similar phase margin degradation. When the phase margin degradation results in negative phase margins, instability in the form of pulse grouping results.

Figure 1:
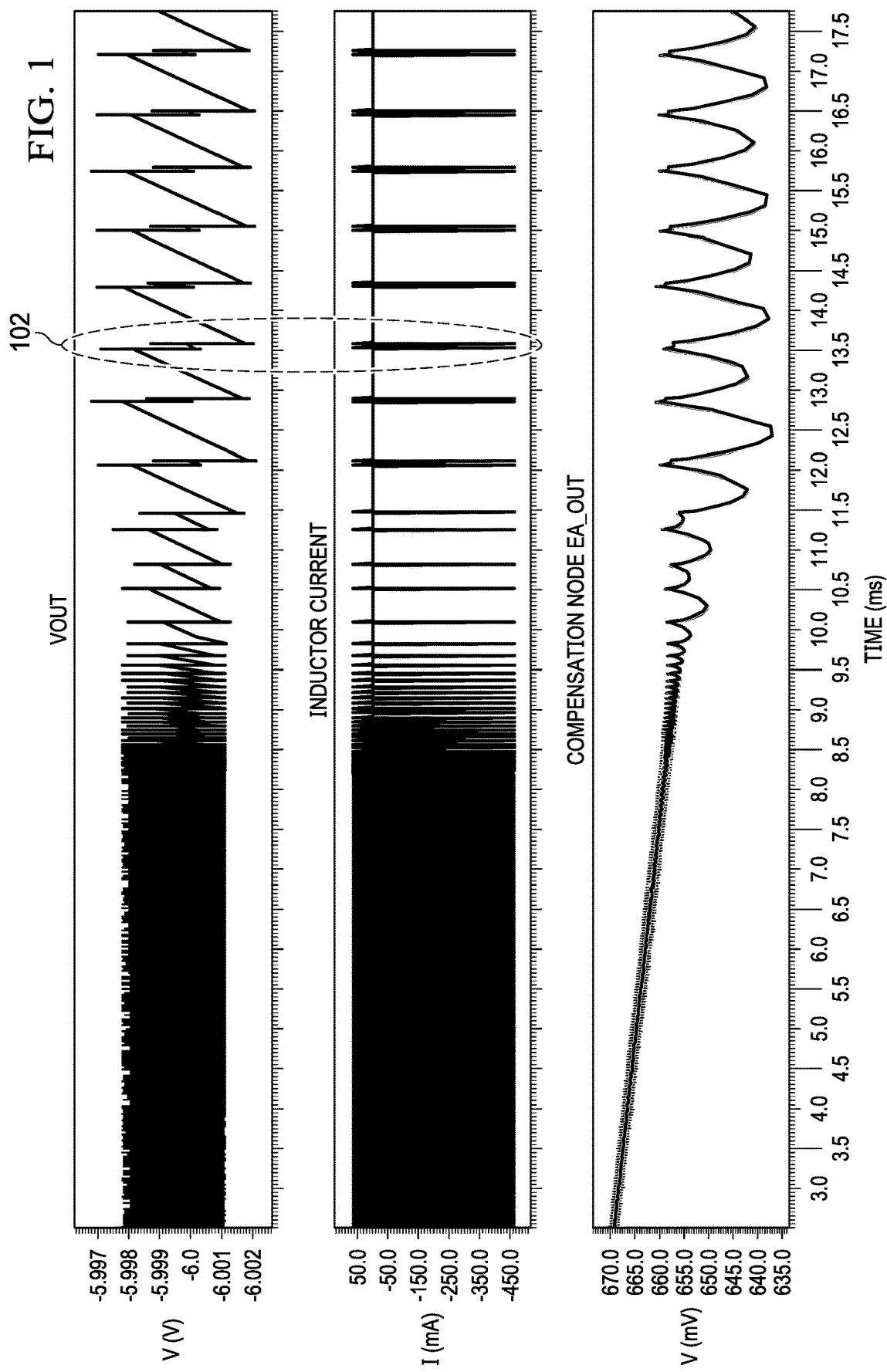
FIG. 1 is a graph of signals in a DC-DC converter exhibiting pulse grouping in pulse frequency mode (PFM) operation.

FIG. 1 shows signals in a DC-DC converter exhibiting pulse grouping in pulse frequency mode (PFM) operation. In this example, the DC-DC converter is an inverting buck-boost converter with type-2 compensation. The load applied to the DC-DC converter decreases over time. As the DC-DC converter's switching frequency decreases with the decreasing load, pulse grouping or bursting occurs in the switching (see region 102). Some DC-DC converters attempt to avoid this behavior by using a dummy load to limit the switching frequency of the DC-DC converter, which limits the bandwidth of the converter, and reduces efficiency with light loads.

The DC-DC converters described herein track the zero of the type-2 compensation circuit with converter switching frequency to maintain phase margin across the entire switching frequency range of the DC-DC converter. By maintaining phase margin, the DC-DC converters avoid pulse grouping with light loads.

Figure 2:
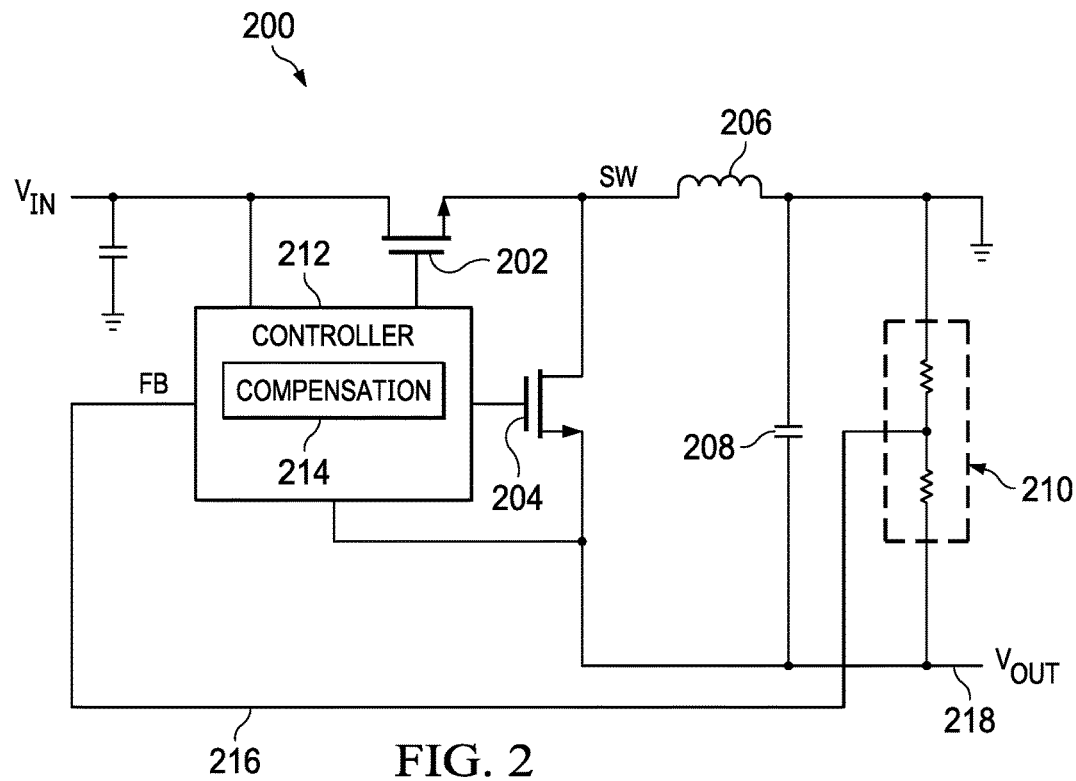
FIG. 2 is a block diagram for an example DC-DC converter that includes compensation zero-tracking based on switching frequency.

FIG. 2 is a block diagram for an example DC-DC converter 200 that includes compensation zero-tracking based on switching frequency. The DC-DC converter 200 includes a high-side transistor 202, a low-side transistor 204, an inductor 206, an output capacitor 208, a voltage divider 210, and a controller 212. The DC-DC converter 200 is configured as an inverting buck-boost converter. Some examples of the DC-DC converter 200 may be configured as a buck converter, a boost converter, a buck-boost converter, or other type of DC-DC converter.

The controller 212 controls switching of the high-side transistor 202 and the low-side transistor 204 to provide a selected output voltage (VOUT) at the output 218. The voltage divider 210 is coupled to the controller 212 for provision of output voltage feedback 216 to the controller 212. The controller 212 controls switching of the high-side transistor 202 and the low-side transistor 204 based on the output voltage feedback 216 received from the voltage divider 210. The controller 212 includes a compensation circuit 214 to stabilize control of VOUT generation. The compensation circuit 214 tracks the zero of the compensation circuit 214 with converter switching frequency to maintain phase margin across the entire switching frequency range of the DC-DC converter 200.

Figure 3:
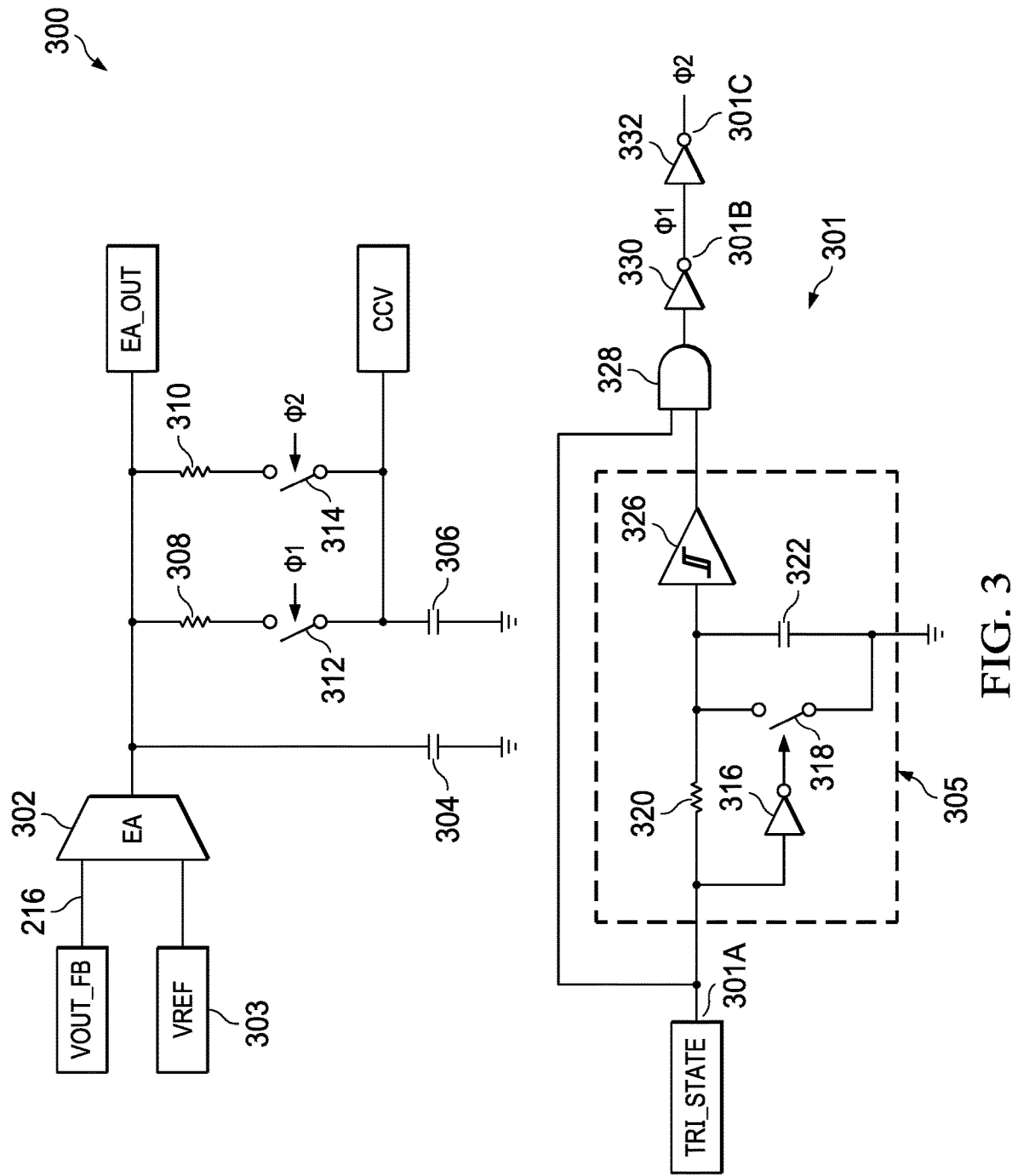
FIG. 3 is a schematic diagram for an example compensation circuit that includes compensation zero-tracking based on switching frequency.

FIG. 3 is a schematic level diagram for an example compensation circuit 300 that includes compensation zero-tracking based on switching frequency. The compensation circuit 300 is an example of the compensation circuit 214. The compensation circuit 300 includes an error amplifier 302, a capacitor 304, a capacitor 306, a resistor 308, a resistor 310, a switch 312, a switch 314, and a switch control circuit 301. The error amplifier 302 includes an input coupled to the voltage divider 210 for receipt of the output voltage feedback 216, and an input coupled to a voltage reference circuit 303. The error amplifier 302 generates an error signal representative of the difference between the output voltage feedback 216 and the reference voltage received from the voltage reference circuit 303.

The capacitor 304 is coupled to the output of the error amplifier 302. The resistor 308 includes a first terminal coupled to the output of the error amplifier 302, and a second terminal coupled to a first terminal of the switch 312. A second terminal of the switch 312 is coupled to a first terminal of the capacitor 306. A second terminal of the capacitor 306 is coupled to ground. The resistor 310 includes a first terminal coupled to the output of the error amplifier 302, and a second terminal coupled to a first terminal of the switch 314. A second terminal of the switch 314 is coupled to a first terminal of the capacitor 306. The switch 312 and the switch 314 may be implemented using field effect transistors (FETs) in some implementations of the compensation circuit 300. The resistance of the resistor 310 may greater (e.g., 10 time greater) than the resistance of the resistor 308.

The switch control circuit 301 controls switching of the switch 312 and the switch 314 to vary the resistance coupling the output of the error amplifier 302 to the capacitor 306, and vary the location of the zero corresponding to the resistance. The switch control circuit 301 include a phase output 301B that is coupled to a control terminal of the switch 312 and a phase output 301C that is coupled to a control terminal of the switch 314. A signal φ1 (a switch control signal) generated by the switch control circuit 301 controls switching of the switch 312, and a signal φ2 (a switch control signal) generated by the switch control circuit 301 controls switching of the switch 314. The signals φ1 and φ2 may be complementary. That is, the signal φ2 may be inverted relative to (an inverted version of) the signal φ1. Accordingly, the switch 312 is closed when the switch 314 is open, and the switch 312 is open when the switch 314 is closed, and the switch control circuit 301 complementarily couples the resistors 308 and 310 to the capacitor 306.

The switch control circuit 301 includes an input terminal 301A that is coupled to a control terminal of the high-side transistor 202 or a control terminal of the low-side transistor 204. The switch control circuit 301 includes a logic gate 328, an inverter 330, an inverter 332, and a delay circuit 305. A first input of the logic gate 328 is coupled to the input terminal 301A, and a second input of the logic gate 328 is coupled to the output of the delay circuit 305. The logic gate 328 combines the signal at the input terminal 301A and the delayed signal output by the delay circuit 305 to produce a control signal for controlling the switch 312 and the switch 314. The output of the logic gate 328 is coupled to an input of the inverter 330, and an output of the inverter 330 (the phase output 301B) is coupled to an input of the inverter 332. The output of the inverter 332 is coupled to the phase output 301C.

The delay circuit 305 includes an inverter 316, a switch 318, a resistor 320, a capacitor 322, and a Schmitt trigger 326. A first terminal of the resistor 320 is coupled to the input terminal 301A and the input of the inverter 316. A second terminal of the resistor 320 is coupled to an input of the Schmitt trigger 326, a first terminal of the switch 318, and a first terminal of the capacitor 322. The output of the inverter 316 is coupled to a control terminal of the switch 318. A second terminal of the switch 318 and a second terminal of the capacitor 322 are coupled to ground. The switch 318 discharges the capacitor 322 when the signal at the input terminal 301A is low. The switch 318 may be implemented using a FET in some implementations of the delay circuit 305. The duty cycles of the signals φ1 and φ2 generated by the switch control circuit 301 change with the frequency of the switching control signal received at the input terminal 301A. The resistance between the output of the error amplifier 302 and the capacitor 306 changes with the duty cycle of the signals φ1 and φ2. The resistance decreases as switching frequency increases, and increases as switching frequency decreases.

Figure 4:
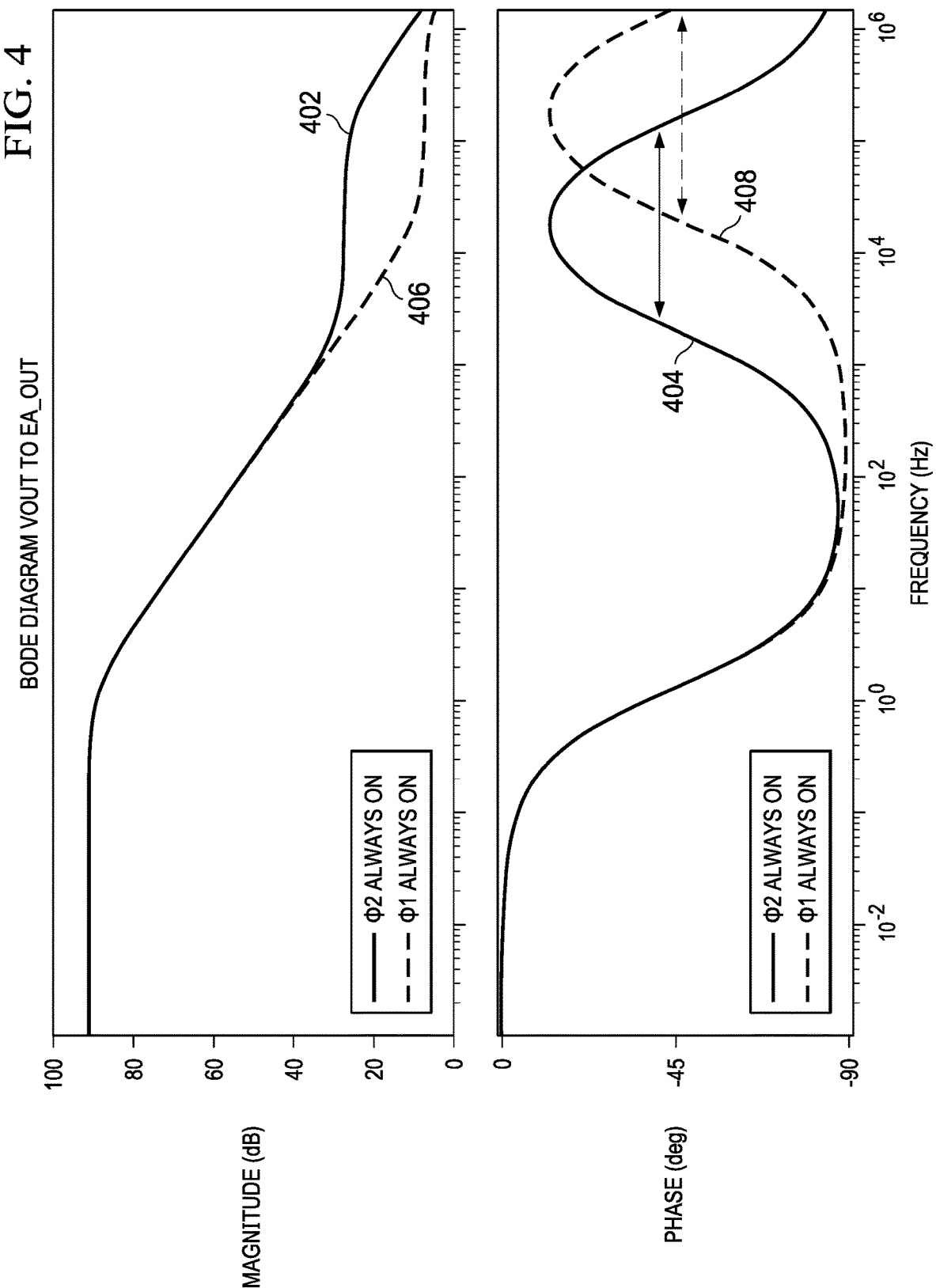
FIG. 4 is a bode diagram for an example of the compensation circuit of FIG. 3.

FIG. 4 is a bode diagram for an example of the compensation circuit 300. The curves 402 and 404 represent magnitude and phase when the signal φ2 is always on (lower switching frequency), and show a phase boost in a lower frequency region (e.g., 2-100 kilohertz). The curves 406 and 408 represent magnitude and phase when the signal φ1 is always on (higher switching frequency), and show a phase boost in a higher frequency region (20 kilohertz to one megahertz). By modulating the duty cycle of the signals φ1 and φ2 with switching frequency, the effective resistance applied in the compensation circuit 300 varies such that the effective phase curve lies between the curves 404 and 408.

Figure 5:
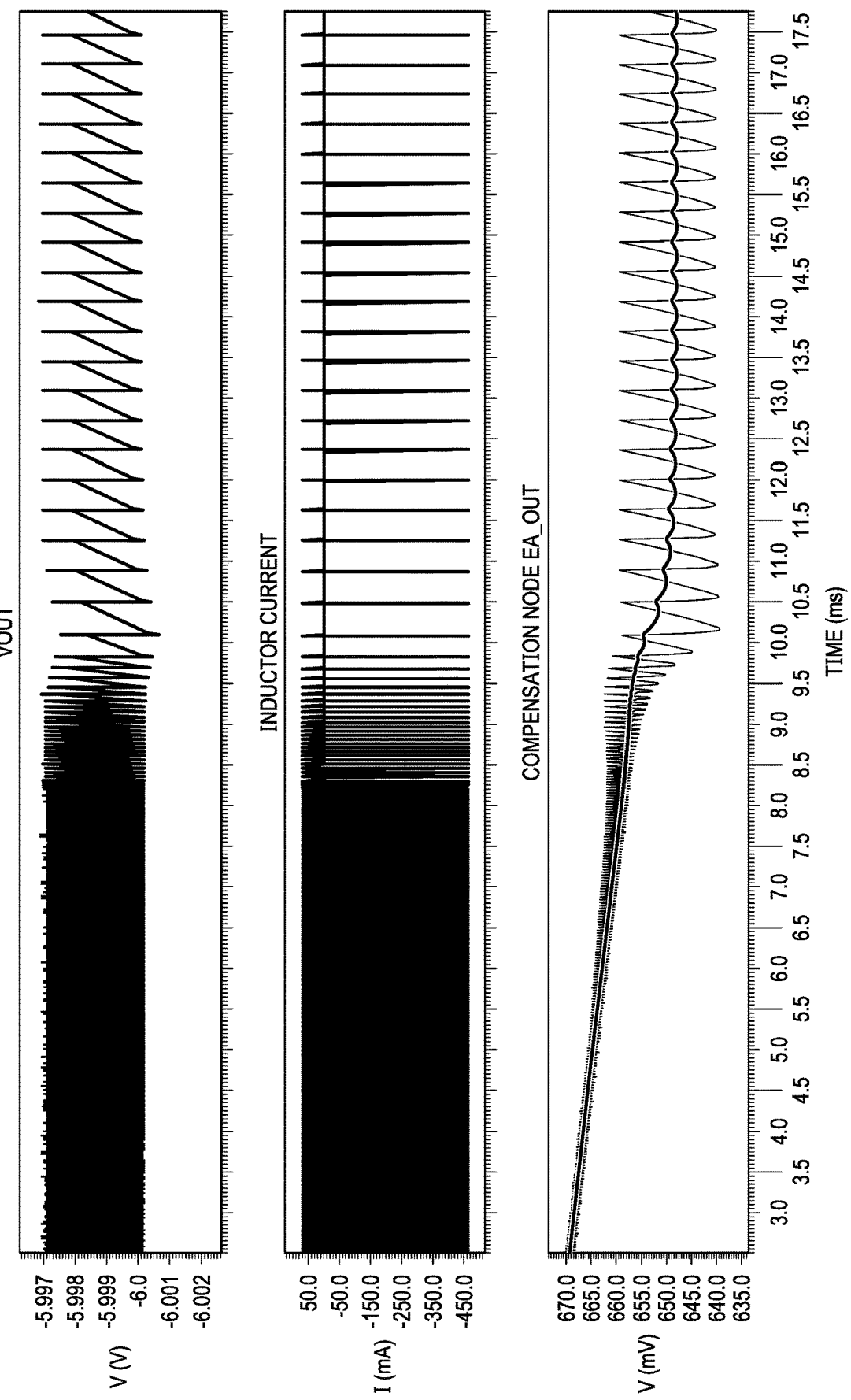
FIG. 5 is a graph of signals in a DC-DC converter that includes an example of the compensation circuit of FIG. 3.

FIG. 5 is a graph of signals in an implementation of the DC-DC converter 200 that includes the compensation circuit 300. In FIG. 5, the load applied to the DC-DC converter 200 is linearly reduced over time. Output voltage, current in the inductor 206, and output of the error amplifier 302 are shown in FIG. 5. The reduction in load causes the switching frequency of the DC-DC converter 200 to decrease. As the switching frequency of the DC-DC converter 200 decreases, the compensation circuit 300 varies the compensation resistance to avoid the pulse grouping shown in FIG. 1.

Figure 6:
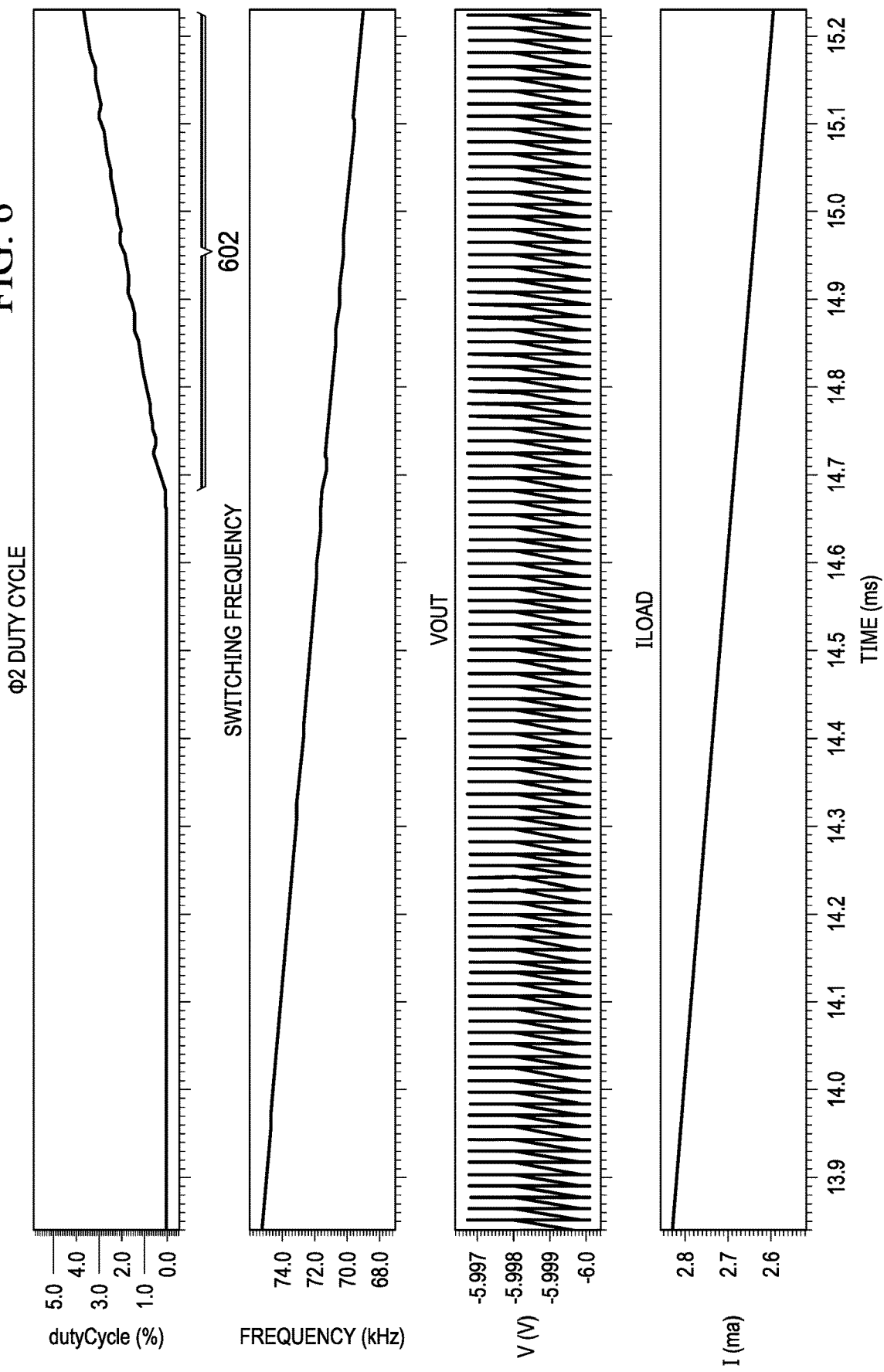
FIG. 6 is a graph showing change in duty cycle applied in the compensation circuit of FIG. 3 with decreasing load.

FIG. 6 is a graph showing change in duty cycle applied in the compensation circuit 300 with decreasing load. As the load decreases, the inductor current and switching frequency of the DC-DC converter 200 also decreases, and the duty cycle of the signal φ2 smoothly increases (interval 602). No undesirable perturbations in the output voltage are present.

Figure 7:
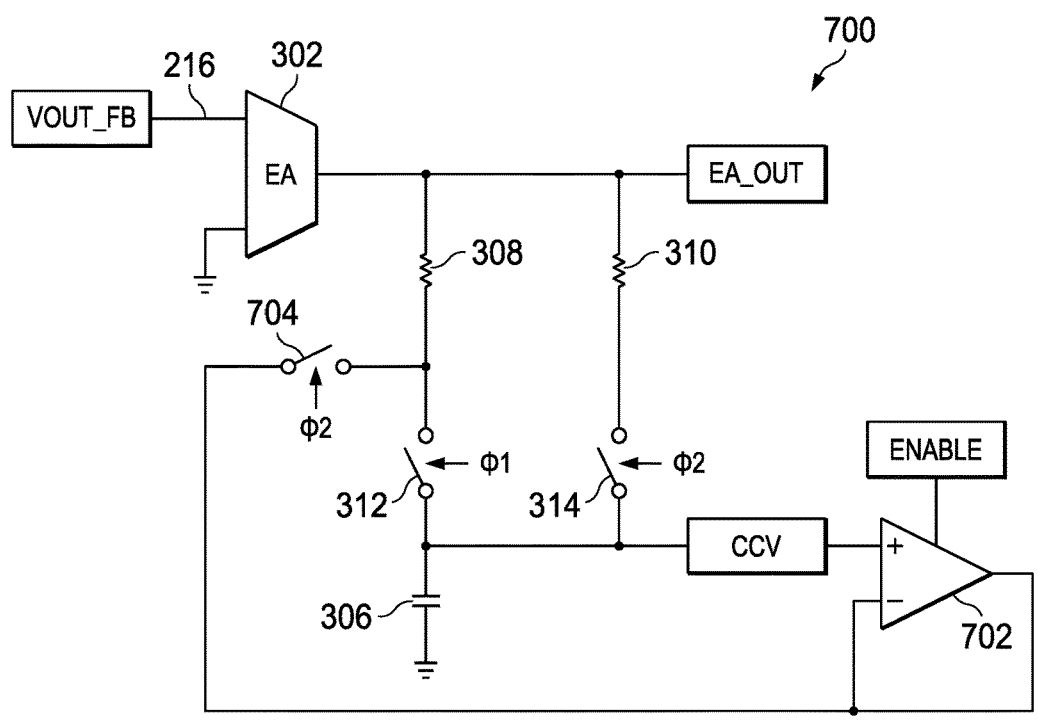
FIG. 7 is a schematic diagram for an example compensation circuit that includes compensation zero-tracking based on switching frequency.

FIG. 7 is a schematic diagram for an example compensation circuit 700 that includes compensation zero-tracking based on switching frequency. The compensation circuit 700 is similar to the compensation circuit 300, and adds capacitance multiplication circuitry. The compensation circuit 700 includes the error amplifier 302, the capacitor 306, the resistor 308, the resistor 310, the switch 312, the switch 314, and the switch control circuit 301 (not shown) as described with respect to the compensation circuit 300.

The compensation circuit 700 further includes an amplifier 702 and a switch 704. The amplifier 702 is a buffer amplifier (e.g., a unity gain buffer). A terminal of the amplifier 702 is coupled to the first terminal of the capacitor 306. The output of the amplifier 702 is coupled to a second input of the amplifier 702, and to a first terminal of the switch 704. A second terminal of the switch 704 is coupled to the first terminal of the switch 312. A control terminal of the switch 704 is coupled to the control terminal of the switch 312. When the switches switch 314 and switch 704 are closed, a capacitance multiplier circuit is formed using the amplifier 702. The switch 704 may implemented using a FET.

FIG. 8 is a bode diagram for an example of the compensation circuit 700. The curves 802 and 804 represent magnitude and phase when the signal φ2 is always on (lower switching frequency), and show a phase boost in a lower frequency region (e.g., 20 kilohertz to 1 megahertz). The curves 806 and 808 represent magnitude and phase when the signal φ1 is always on (higher switching frequency), and show a phase boost in a higher frequency region (20 kilohertz to 1 megahertz). By modulating the duty cycle of the signals φ1 and φ2 with switching frequency, the effective capacitance of the compensation circuit is controlled, and the region of phase boost 810 is extended with switching frequency. Gain in the region of phase boost 810 remains relatively constant.

Figure 9:
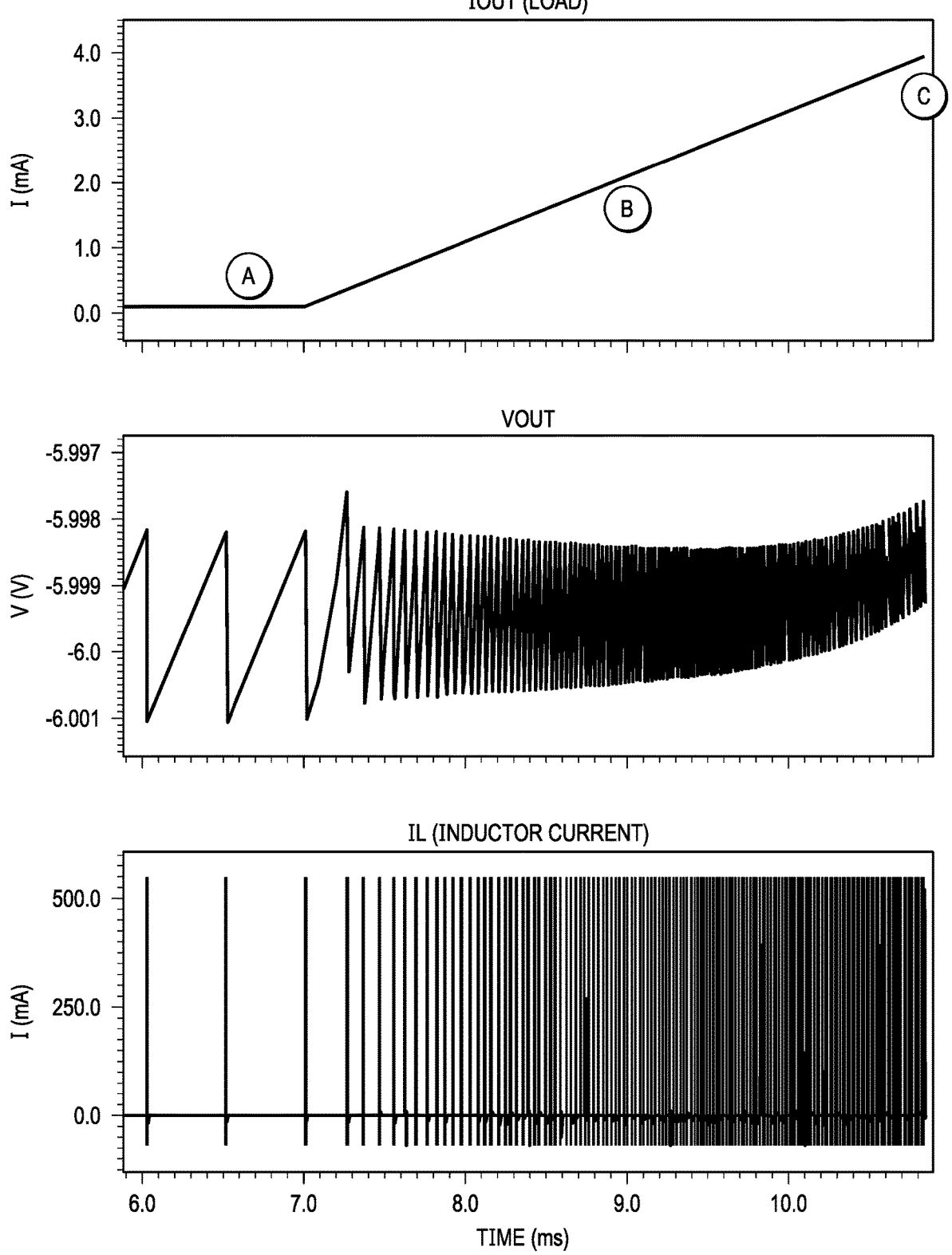
FIG. 9 is a graph of signals in a DC-DC converter that includes an example of the compensation circuit of FIG. 7.

FIG. 9 is a graph of signals in a DC-DC converter that includes an example of the compensation circuit 700. In FIG. 9, load current increases from about 100 microamperes (at time A) to about 4 milliamperes (at time C) over time. The change in load has little impact on the output voltage, and the inductor current and output voltage show that no pulse grouping is present.

Figure 10A:
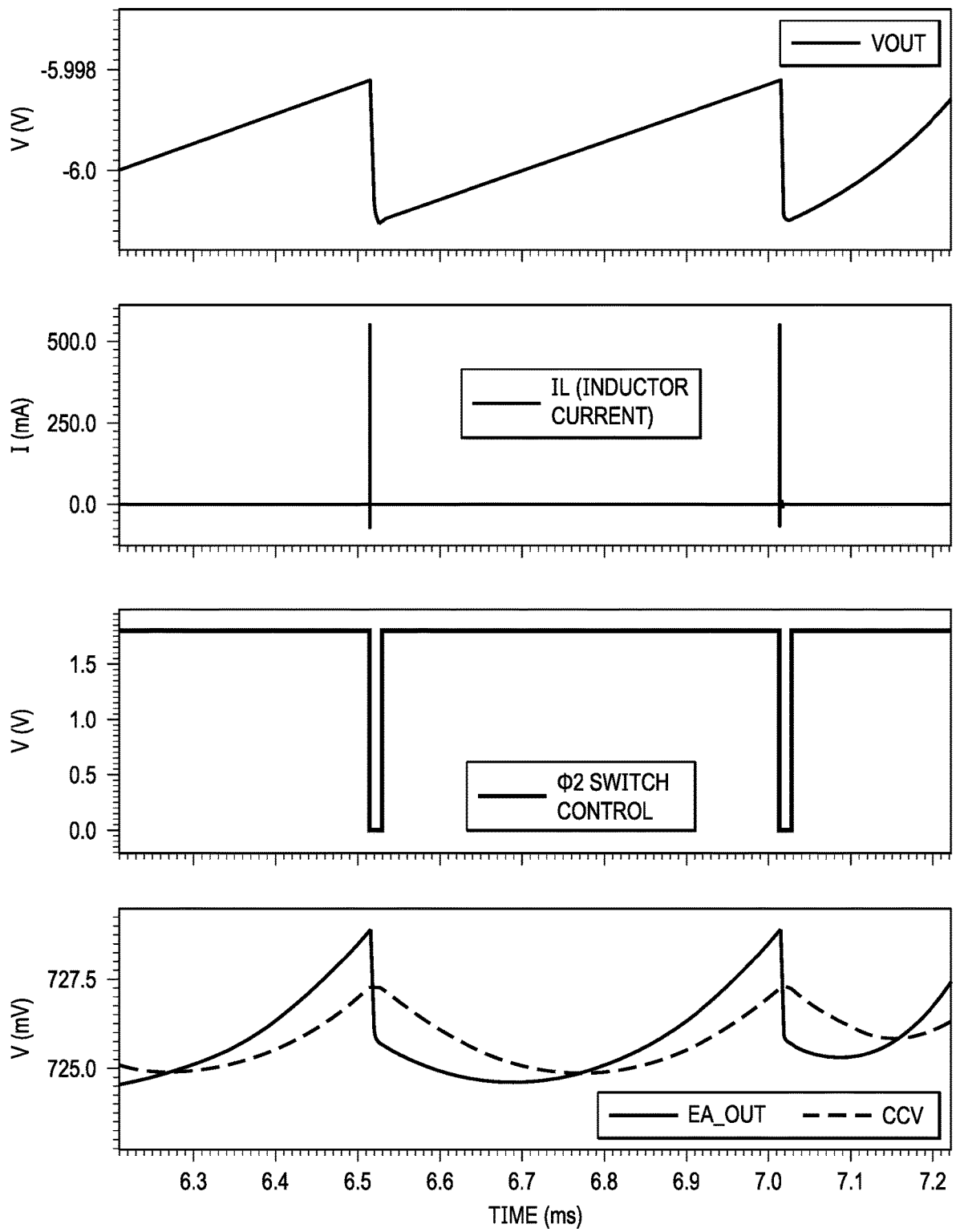
FIGS. 10A-10C are a graphs of magnified signals shown in the graph of FIG. 9.
Figure 10B:
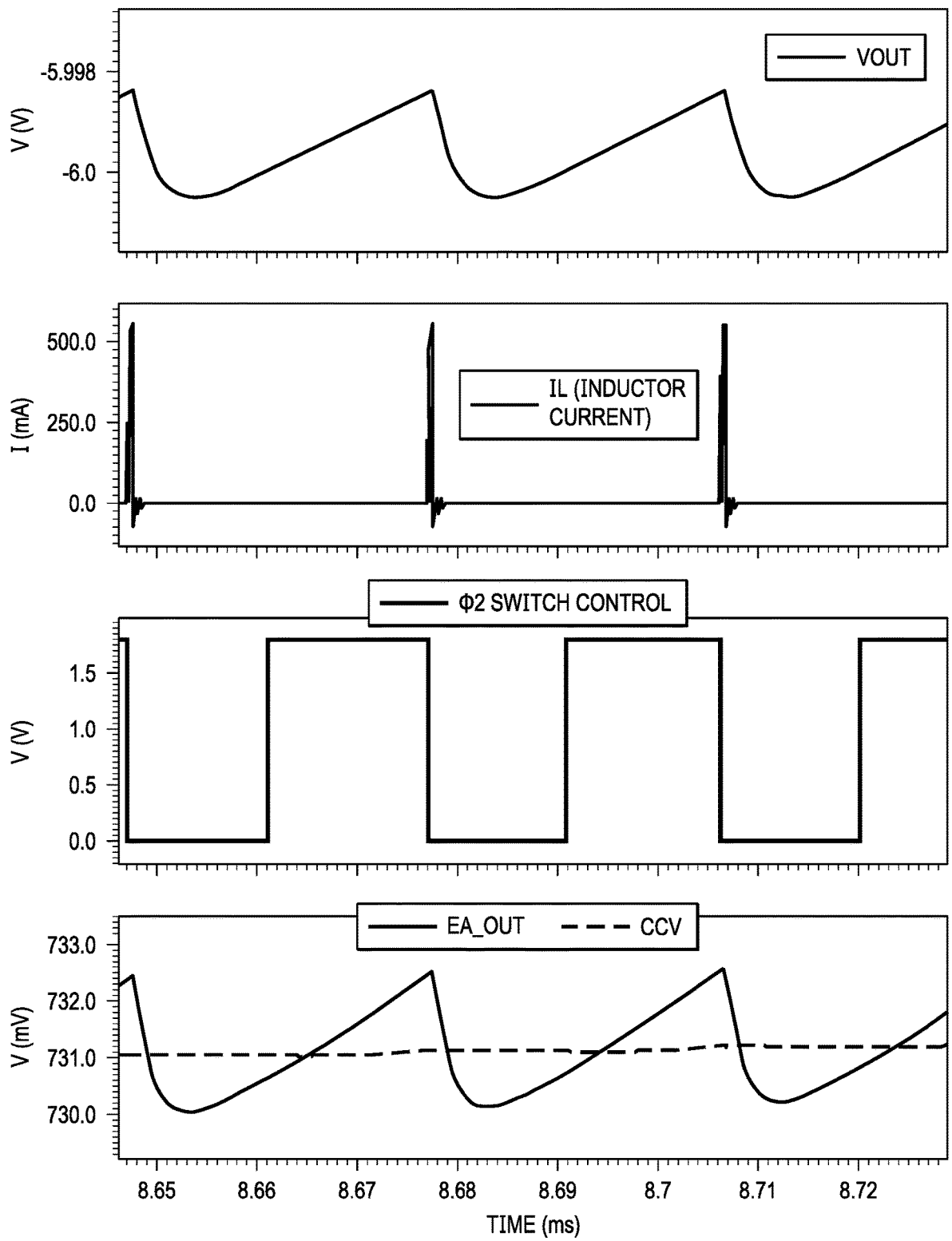
Figure 10C:
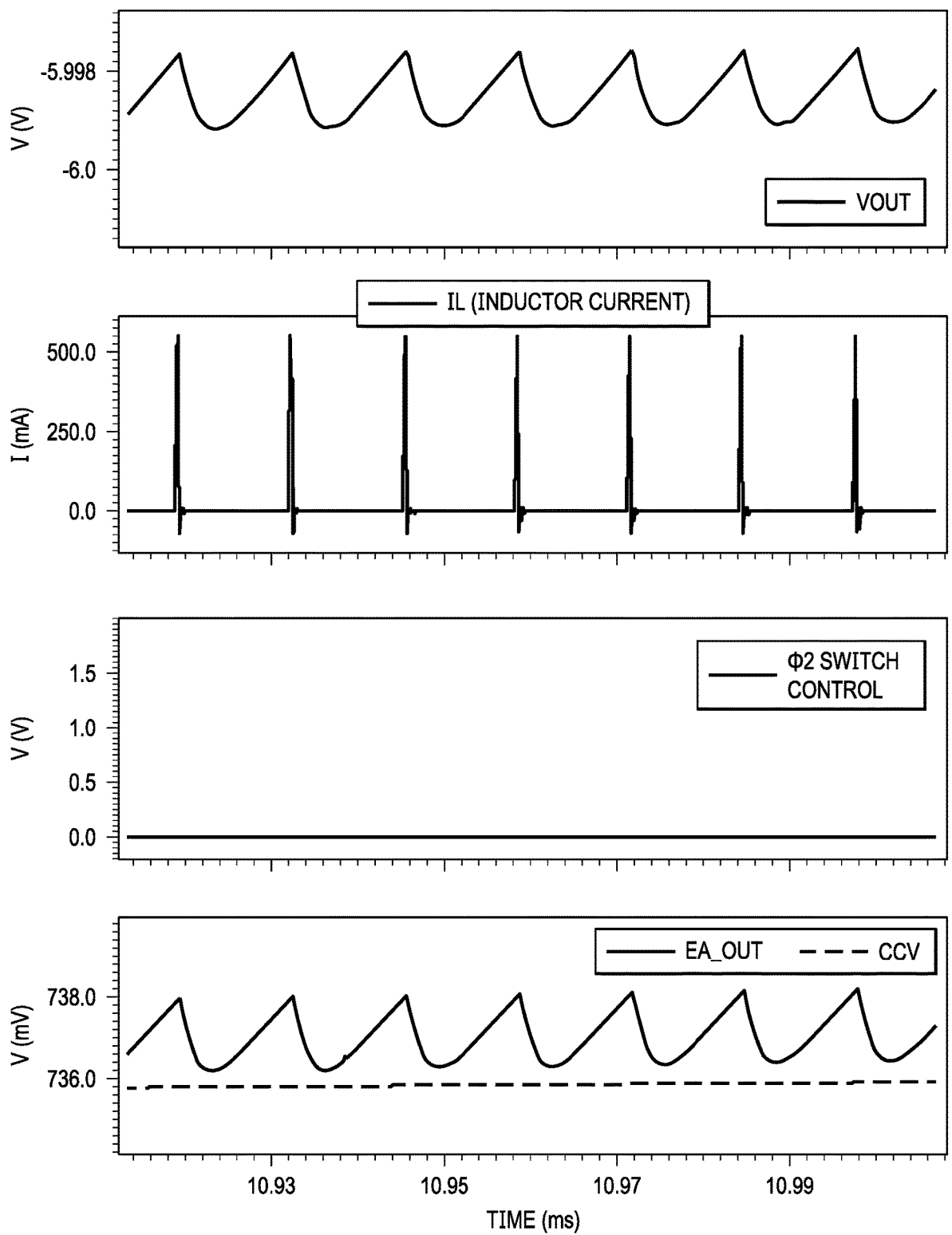

FIGS. 10A-10C are graphs of magnified signals from the graph of FIG. 9. FIG. 10A zooms in on the signals of the graph of FIG. 9 at time A (about 100 microamperes of load current). The DC-DC converter switching frequency is about 2 kilohertz. The signal φ2 is activated after each switching operation with delay. Due to the low switching frequency, the signal φ2 is high, and the capacitance multiplier of the compensation circuit 700, is active most of the time to provide a phase-boost.

FIG. 10B zooms in on the signals of the graph of FIG. 9 at time B (about 1.8 milliamperes of load current). The DC-DC converter switching frequency is about 33 kilohertz. The signal φ2 is activated after each switching operation with delay. The signal φ2 is high and the capacitance multiplier of the compensation circuit 700 is active about half of the time.

FIG. 10C zooms in on the signals of the graph of FIG. 9 at time C (about 4 milliamperes of load current). The DC-DC converter switching frequency is about 77 kilohertz. The signal φ2 is not activated (the signal φ1 is always active), and the capacitance multiplier of the compensation circuit 700 is off. Because of the higher switching frequency, no phase boost in the lower frequency range is needed.

In this description, the term "couple" may cover connections, communications or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Modifications are possible in the described embodiments, and other embodiments are possible, within the scope of the claims.

What is claimed is:

1. A DC-DC converter, comprising:
    an error amplifier having an error output;
    a compensation circuit including:
        a first resistor having first and second resistor terminals, wherein the first resistor terminal is coupled to the error output;
        a first switch having first and second switch terminals and a first control terminal, wherein the first switch terminal is coupled to the second resistor terminal;
        a second resistor having third and fourth resistor terminals, wherein the third resistor terminal is coupled to the error output;
        a second switch coupled between the fourth resistor terminal and the second switch terminal, and having a second control terminal; and
        a capacitor coupled between the second switch terminal and a ground terminal.

2. The DC-DC converter of claim 1, wherein the compensation circuit includes a buffer amplifier having a buffer input and a buffer output, wherein the buffer input is coupled to the capacitor, and the buffer output is coupled to the first switch terminal.

3. The DC-DC converter of claim 2, wherein the compensation circuit includes a third switch having fifth and sixth switch terminals and a third control terminal, wherein the fifth switch terminal is coupled to the buffer output, and the sixth switch terminal is coupled to the first switch terminal.

4. The DC-DC converter of claim 1, wherein the compensation circuit includes a switch control circuit having first and second phase outputs, wherein the first phase output is coupled to the first control terminal, and the second phase output is coupled to the second control terminal.

5. The DC-DC converter of claim 4, wherein the switch control circuit includes:
a logic gate having first and second logic inputs and a logic output, wherein the first logic input is coupled to an input terminal;
a delay circuit having a delay input and a delay output, wherein the delay input is coupled to the input terminal, and the delay output is coupled to the second logic input;
a first inverter having a first inverter input and a first inverter output, wherein the first inverter input is coupled to the logic output; and
a second inverter having a second inverter input and a second inverter output, wherein the second inverter input is coupled to the first inverter output, and the second inverter output is coupled to the second phase output.

6. The DC-DC converter of claim 5, wherein the delay circuit includes:
a third resistor having fifth and sixth resistor terminals, wherein the fifth resistor terminal is coupled to the first logic input;
a Schmitt trigger having a trigger input and a trigger output, wherein the trigger input is coupled to the sixth resistor terminal; and
a third capacitor coupled between the sixth resistor terminal and the ground terminal.

7. The DC-DC converter of claim 6, wherein the delay circuit includes:
a third switch coupled between the sixth resistor terminal and the ground terminal, and having a third control terminal; and
a third inverter having a third inverter input and a third inverter output, wherein the third inverter input is coupled to the fifth resistor terminal, and the third inverter output is coupled to the third control terminal.

8. A DC-DC converter, comprising:
an error amplifier coupled to an output terminal and a reference voltage source, and configured to provide an error signal representative of a difference between a voltage at the output terminal and a reference voltage provided by the reference voltage source;
a compensation circuit that includes:
a first resistor coupled to the error amplifier;
a first switch coupled between the first resistor and a capacitor, and having a first control terminal;
a second resistor coupled to the error amplifier; and
a second switch coupled between the second resistor and the capacitor, and having a second control terminal; and
a switch control circuit coupled to the first control terminal and to the second control terminal, and configured to modulate connection of the first resistor to the capacitor and connection of the second resistor to the capacitor responsive to a switching frequency of the DC-DC converter.

9. The DC-DC converter of claim 8, wherein:
the switch control circuit is configured to complementarily couple the first resistor and the second resistor to the capacitor; and
a time of connection of the first resistor to the capacitor increases with an increase of the switching frequency of the DC-DC converter.

10. The DC-DC converter of claim 8, wherein a resistance of the second resistor is greater than a resistance of the first resistor.

11. The DC-DC converter of claim 8, wherein:
the switch control circuit is configured to:
provide a first switch control signal to modulate the first switch; and
provide a second switch control signal to modulate the second switch; and
the second switch control signal is an inverted version of the first switch control signal.

12. The DC-DC converter of claim 11, wherein the compensation circuit includes a capacitance multiplier circuit that includes:
a buffer amplifier having a buffer input and a buffer output, wherein the buffer input is coupled to the capacitor; and
a third switch coupled between the buffer output and the first switch and having a third control terminal, wherein the third control terminal is coupled to the switch control circuit, and the second switch control signal controls the third switch.

13. An inverting buck-boost converter, comprising:
a high-side transistor;
a low-side transistor;
a controller coupled to an output terminal, the high-side transistor, and the low-side transistor, wherein the controller includes:
a reference voltage source providing a reference voltage;
an error amplifier coupled to the output terminal and the reference voltage source, and configured to provide an error signal proportional to a difference between a voltage at the output terminal and the reference voltage; and
a compensation circuit coupled to the error amplifier, the compensation circuit:
a first resistor coupled to the error amplifier;
a capacitor coupled to the first resistor;
a first switch coupled between the first resistor and the capacitor;
a second resistor coupled to the error amplifier; and
a second switch coupled between the second resistor and the capacitor; and
a switch control circuit configured to control the first switch and the second switch responsive to a switching frequency of the high-side transistor and the low-side transistor.

14. The inverting buck-boost converter of claim 13, wherein the switch control circuit is configured to:
increase a time of connection of the first resistor to the capacitor as the switching frequency increases; and
increase a time of connection of the second resistor to the capacitor as the switching frequency decreases.

15. The inverting buck-boost converter of claim 13, wherein a resistance of the second resistor is greater than a resistance of the first resistor.

16. The inverting buck-boost converter of claim 13, wherein the compensation circuit includes a capacitance multiplier circuit:

a buffer amplifier having a buffer input and a buffer output, wherein the buffer input is coupled to a first terminal of the first switch, and the buffer output is coupled to a second terminal of the first switch.

17. The inverting buck-boost converter of claim 16, wherein:
the switch control circuit is configured to:
provide a first switch control signal to control the first switch; and
provide a second switch control signal to control the second switch; and
the second switch control signal is an inverted version of the first switch control signal.

18. The inverting buck-boost converter of claim 17, wherein
the capacitance multiplier circuit includes:
a third switch coupled between the buffer output and the second terminal of the first switch, wherein the second switch control signal controls the third switch.

* * * * *